(12) United States Patent
Lee et al.

(10) Patent No.: US 10,347,176 B2
(45) Date of Patent: Jul. 9, 2019

(54) DISPLAY APPARATUS AND METHOD OF MANUFACTURING THE SAME

(71) Applicant: SAMSUNG DISPLAY CO., LTD., Yongin-si, Gyeonggi-Do (KR)

(72) Inventors: Sunhee Lee, Yongin-si (KR); Sunho Kim, Yongin-si (KR); Juchan Park, Yongin-si (KR); Younggug Seol, Yongin-si (KR); Jonghyun Choi, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 15/870,568

(22) Filed: Jan. 12, 2018

(65) Prior Publication Data

US 2018/0322826 A1 Nov. 8, 2018

(30) Foreign Application Priority Data

May 8, 2017 (KR) .......................... 10-2017-0057371

(51) Int. Cl.
*G06F 1/16* (2006.01)
*G06F 3/041* (2006.01)
(Continued)

(52) U.S. Cl.
CPC ......... *G09G 3/3225* (2013.01); *G06F 1/1643* (2013.01); *G06F 1/1652* (2013.01);
(Continued)

(58) Field of Classification Search
CPC ..... G09G 3/3225; H01L 27/15; H01L 27/323; H01L 27/3288; H01L 27/3276; H01L 27/3262; H01L 37/3267; H01L 51/0097; H01L 21/3267; H01L 25/075; H01L 25/0753; H01L 25/0756; H01L 51/0096; H01L 51/5237; H01L 2251/5338;
(Continued)

(56) References Cited

U.S. PATENT DOCUMENTS 9,430,180 B2 8/2016 Hirakata et al.
2010/0065832 A1* 3/2010 Sugimoto ........... H01L 27/3293
257/40

(Continued)

FOREIGN PATENT DOCUMENTS

JP 2016-197261 11/2016
KR 10-2015-0094989 8/2015
(Continued)

OTHER PUBLICATIONS

Extended European Search Report dated Sep. 28, 2018 for European Patent Application No. 18170898.3.

*Primary Examiner* — Joseph L Williams
*Assistant Examiner* — Jose M Diaz
(74) *Attorney, Agent, or Firm* — F. Chau & Associates, LLC

(57) ABSTRACT

A display apparatus includes: a center region that displays an image; a first edge region and a second edge region, each folded with respect to the center region; and a first corner region connected to the first edge region and the second edge region and that includes at least one folding line and a first surface and a second surface that face each other by being folded along the at least one folding line.

20 Claims, 8 Drawing Sheets

(51) Int. Cl.
*H01L 27/32* (2006.01)
*H01L 51/00* (2006.01)
*G09G 3/3225* (2016.01)

(52) U.S. Cl.
CPC .......... *G06F 3/0412* (2013.01); *H01L 27/323* (2013.01); *H01L 27/3262* (2013.01); *H01L 27/3267* (2013.01); *H01L 27/3276* (2013.01); *H01L 27/3288* (2013.01); *H01L 51/0097* (2013.01)

(58) Field of Classification Search
CPC . H05B 33/0803; G06F 3/0412; G06F 1/1643; G06F 1/1652
See application file for complete search history.

(56) References Cited

U.S. PATENT DOCUMENTS

| | | | | |
|---|---|---|---|---|
| 2011/0050657 A1* | 3/2011 | Yamada | ............. | H01L 27/3293 345/204 |
| 2012/0218219 A1* | 8/2012 | Rappoport | .......... | H01L 27/3276 345/174 |
| 2013/0002133 A1* | 1/2013 | Jin | ...................... | H01L 51/5253 313/511 |
| 2013/0002583 A1* | 1/2013 | Jin | ........................ | G06F 1/1637 345/173 |
| 2013/0328792 A1 | 12/2013 | Myers et al. | | |
| 2015/0227172 A1 | 8/2015 | Namkung et al. | | |
| 2016/0270209 A1 | 9/2016 | Cho | | |
| 2016/0374191 A1 | 12/2016 | Kim et al. | | |
| 2018/0114470 A1* | 4/2018 | Nagayama | ................ | G09F 9/30 |

FOREIGN PATENT DOCUMENTS

| | | | | |
|---|---|---|---|---|
| KR | 10-2016-0149385 | | 12/2016 | |
| WO | WO 2016101476 A1 * | | 6/2016 | ............... G09F 9/30 |

* cited by examiner

DISPLAY APPARATUS AND METHOD OF MANUFACTURING THE SAME

CROSS-REFERENCE TO RELATED APPLICATION

This application claims priority under 35 U.S.C. § 119 from, and the benefit of, Korean Patent Application No. 10-2017-0057371, filed on May 8, 2017 in the Korean Intellectual Property Office, the contents of which are herein incorporated by reference in their entirety.

BACKGROUND

1. Technical Field

One or more embodiments are directed to a display apparatus and a method of manufacturing the same, and more particularly, to a display apparatus having a 3-dimensional (3D) structure and a method of manufacturing the same.

2. Discussion of the Related Art

In general, a display apparatus has a display region on a substrate. Recently, a display apparatus has been developed in which at least a part of the display apparatus is bent to increase visibility at various viewing angles or to decrease an area of a non-display region.

However, when adjacent regions are bent in different directions, interference can occur in a corner region.

SUMMARY

One or more embodiments include a display apparatus, in which adjacent edge regions can be easily folded, and a non-active area seen by a user can be reduced in size by using a corner region as the non-active area where wirings and an embedded circuit portion are provided and configuring the non-active area to be not seen, and a method of manufacturing the display apparatus.

Additional aspects will be set forth in part in the description which follows and, in part, will be apparent from the description, or may be learned by practice of the presented embodiments.

According to one or more embodiments, a display apparatus includes: a center region; a first edge region and a second edge region, each folded with respect to the center region; and a first corner region connected to the first edge region and the second edge region that includes at least one folding line, and a first surface and a second surface that face each other by being folded along the at least one folding line.

The display apparatus may further include an adhesive layer disposed between the first surface and the second surface.

The first corner region may be folded with respect to the first edge region and the second edge region in a direction away from where an image is displayed.

The center region, the first edge region, and the second edge region may each include a display device that displays an image, and each display device may include a pixel electrode, an intermediate layer disposed on the pixel electrode that includes an organic emission layer, and an opposite electrode disposed on the intermediate layer.

The first corner region may include: a wiring portion that includes a plurality of wirings; and an embedded circuit portion that includes at least one thin-film transistor that controls signals received from the plurality of wirings.

The first corner region may further include an insulating structure that has an opening that corresponds to the at least one folding line and that includes at least one inorganic insulating layer.

The display apparatus may further include a lower organic layer and an upper organic layer disposed in the opening, wherein the plurality of wirings may be disposed at the at least one folding line between the lower organic layer and the upper organic layer.

At least one of the first edge region and the second edge region may include an active area that displays an image and a non-active area disposed outside the active area.

The first corner region may further include an additional folding line in at least one of a region between the at least one folding line and the first edge region and a region between the at least one folding line and the second edge region.

The center region may be rectangular, and the display apparatus may further include the a third edge region, and a fourth edge region, wherein the first edge region, the second edge region, the third edge region and the fourth edge region respectively extend from each of four sides of the center region.

The first edge region, the second edge region, the third edge region, and the fourth edge region may each be folded with respect to the center region in a direction away from where an image is displayed, and the display apparatus may further include a second corner region, a third corner region, and a fourth corner region respectively disposed between the second edge region and the third edge region, between the third edge region and the fourth edge region, and between the fourth edge region and the first edge region, each including a folding line.

The display apparatus may further include a pad region that extends from at least one of the first through fourth edge regions, wherein the pad region may be folded with respect to the at least one of the first through fourth edge regions.

According to one or more embodiments, a method of manufacturing a display apparatus includes: preparing a display panel that includes a center region, a first edge region and a second edge region that extend in different directions from the center region, and a corner region disposed between the first edge region and the second edge region and that includes a folding line; folding the first edge region and the second edge region with respect to the center region in a direction away from where an image is displayed; and folding the corner region along the folding line such that a first surface and a second surface of the corner region face each other.

The method may further include, before folding the corner region, forming an adhesive layer on at least one of the first surface and the second surface of the corner region.

The method may further include, before folding the corner region, removing a part of the corner region.

The center region, the first edge region, and the second edge region may each include a display device that displays an image.

The corner region may include: a wiring portion that includes a plurality of wirings; and an embedded circuit portion that includes at least one thin-film transistor that controls signals received from the plurality of wirings.

The corner region may further include an insulating structure that has an opening corresponding to the folding line that includes at least one inorganic insulating layer.

The display apparatus may further include a lower organic layer and an upper organic layer disposed in the opening, wherein the plurality of wirings at the folding line may be disposed between the lower organic layer and the upper organic layer.

According to one or more embodiments, a display apparatus includes: a center region that displays an image; and a first corner region connected to adjacent edges of the center region. The first corner region includes at least one folding line and a first surface and a second surface that face each other by being folded along the at least one folding line. The first corner region is folded with respect to the edges of the center region in a direction away from where an image is displayed.

DETAILED DESCRIPTION

Figure 1:
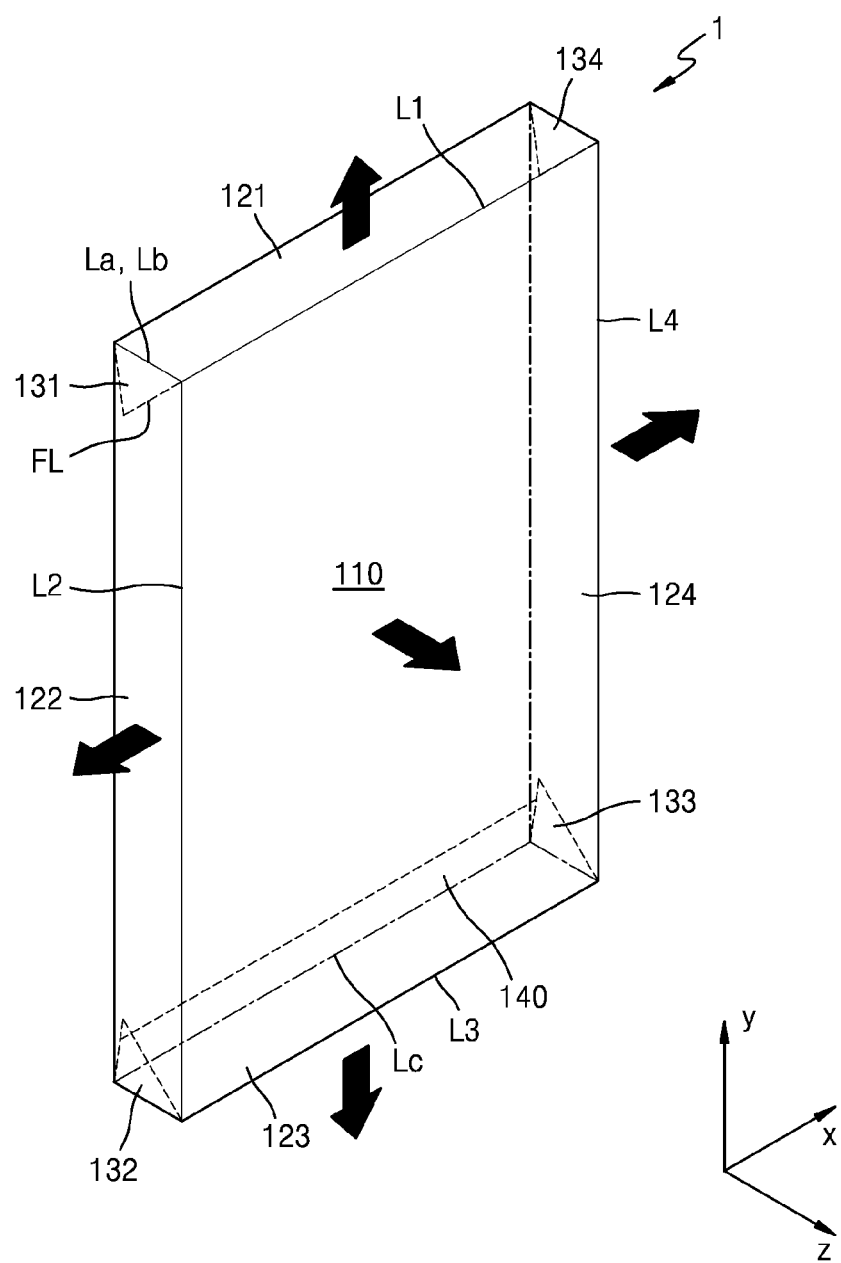
FIG. 1 is a perspective view of a display apparatus according to an embodiment.

Reference will now be made in detail to embodiments, examples of which are illustrated in the accompanying drawings. In this regard, exemplary embodiments may have different forms and should not be construed as being limited to the descriptions set forth herein. Accordingly, exemplary embodiments are merely described below, by referring to the figures, to explain aspects of the present description.

One or more exemplary embodiments of the present disclosure will be described below in more detail with reference to the accompanying drawings. Those components that are the same or are in correspondence may use the same reference numeral, and redundant explanations are omitted.

It will be understood that when a layer, region, or component is referred to as being "formed on," another layer, region, or component, it can be directly or indirectly formed on the other layer, region, or component. Sizes of elements in the drawings may be exaggerated for convenience of explanation.

Figure 2:
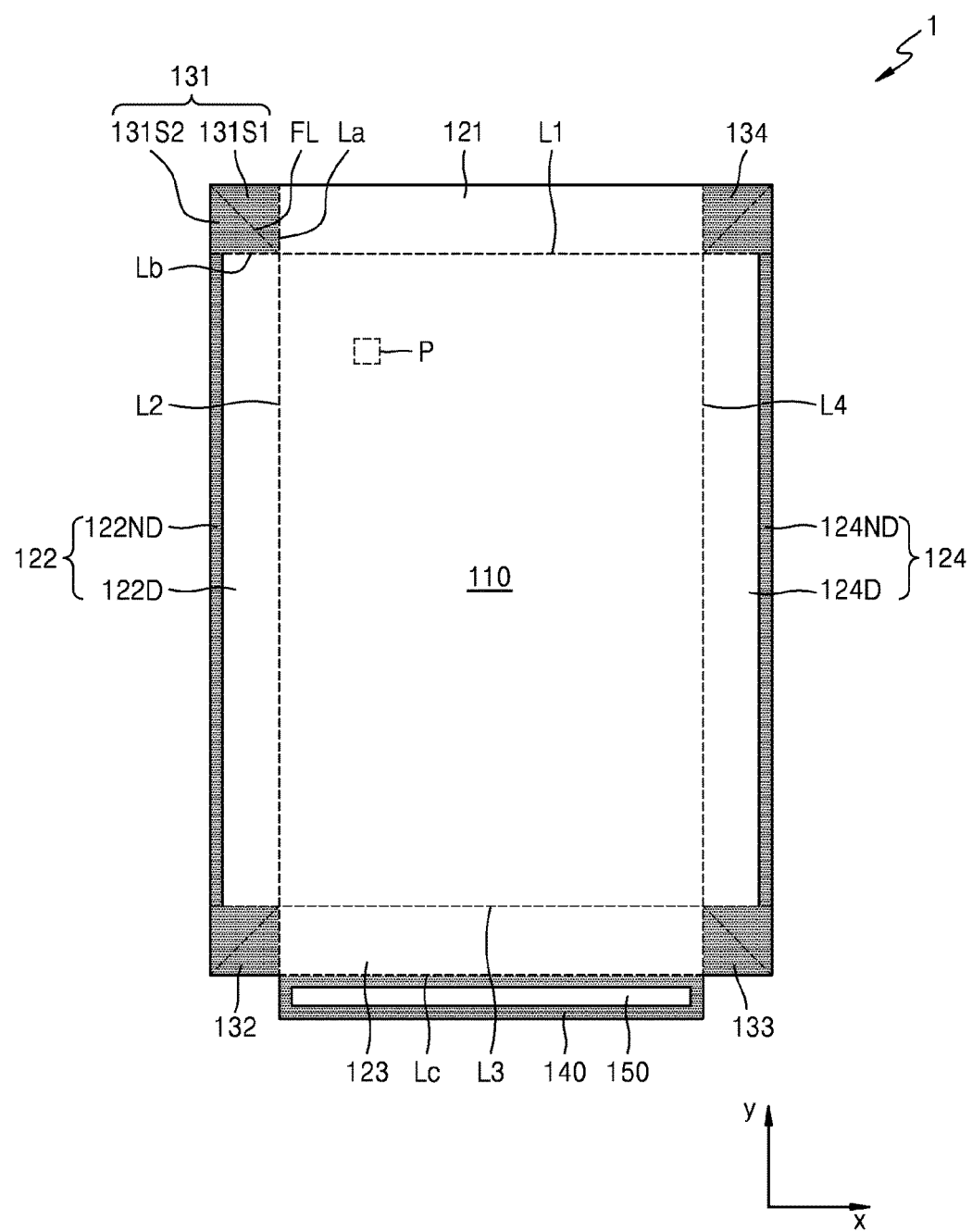
FIG. 2 is a pre-folding plan view of a display apparatus of FIG. 1.

FIG. 1 is a perspective view of a display apparatus 1 according to an embodiment, and FIG. 2 is a pre-folding plan view of the display apparatus 1 of FIG. 1.

The display apparatus 1 according to an embodiment includes a center region 110, a first edge region 121 and a second edge region 122, each folded with respect to the center region 110, and a first corner region 131 connected to the first edge region 121 and the second edge region 122 that includes at least one folding line FL, and a first surface 131S1 and a second surface 131S2 that are folded along the folding line FL to face each other.

According to an embodiment, a substrate 100 (see FIGS. 3B and 4, below) that is a part of the display apparatus 1 is folded, and thus a part of the display apparatus 1 is folded like the substrate 100, and the term "folding" used hereinafter may be interpreted to also mean "bending". As shown in FIG. 1, the display apparatus 1 may be a 3-dimensional (3D) display apparatus formed by bending at least a part of the substrate 100 as shown in FIG. 2.

Referring to FIG. 1, according to an embodiment, the display apparatus 1 includes the center region 110 that includes a plurality of pixels P that display an image. Each pixel includes a display device 40, shown in FIG. 4, disposed in a center region 110 on the substrate 100, and an image is displayed by the pixels P by driving the display device 40 using a driving circuit unit that includes a plurality of thin-film transistors (TFTs), i.e., a first TFT T1 and a second TFT T2, shown in FIG. 4, and a storage capacitor Cst.

According to an embodiment, the display apparatus 1 includes the first edge region 121, the second edge region 122, a third edge region 123, and a fourth edge region 124, each folded with respect to the center region 110. First through fourth edge regions 121 through 124 are folded in a direction away from where an image is displayed, respectively, along first through fourth lines L1 through L4 with respect to the center region 110. In FIGS. 1 and 2, the center region 110 and the first through fourth edge regions 121 through 124 are each rectangular, but shapes thereof are not limited thereto, and at least one of the center region 110 and the first through fourth edge regions 121 through 124 may be polygonal.

According to an embodiment, each of the first through fourth edge regions 121 through 124 includes the display device 40, which can display an image. The center region 110 and the first through fourth edge regions 121 through 124 can display independent images. Alternatively, the center region 110 and the first through fourth edge regions 121 through 124 can display continuous images or can selectively display independent images or continuous images, based on an external input. The center region 110 can project an image in one direction (+z direction), and the first through fourth edge regions 121 through 124 can project images respectively in a +y direction, a −x direction, a −y direction, and a +z direction. The first through fourth edge regions 121 through 124 are folded not perpendicularly but at a non-right angle with respect to the center region 110, and the first through fourth edge regions 121 through 124 project images in various directions based on the folded angles.

According to another embodiment, at least one of the first through fourth edge regions 121 through 124 does not display an image. According to another embodiment, the display apparatus 1 includes only two or three edge regions bent with respect to a center region 110.

According to an embodiment, the display apparatus 1 includes a plurality of corner regions, and the plurality of corner regions include the first corner region 131 between the first and second edge regions 121 and 122, a second corner region 132 between the second and third edge regions 122 and 123, a third corner region 133 between the third and fourth edge regions 123 and 124, and a fourth corner region 134 between the fourth and first edge regions 124 and 121. However, if the display apparatus 1 includes two edge regions, the display apparatus 1 includes one corner region.

According to an embodiment, the first corner region 131 includes at least one folding line FL, and the first surface 131S1 and the second surface 131S2 are folded along the folding line FL to face each other. The first and second surfaces 131S1 and 131S2 may directly contact each other, or an adhesive layer 160 (see FIG. 3A) may be disposed therebetween. The first corner region 131 is folded with respect to the first and second edge regions 121 and 122 in a direction away from where an image is displayed along a first corner line La and a second corner line Lb. In other words, by folding the first corner region 131 as shown in FIG. 2 along the first corner line La, the second corner line Lb, and the folding line FL, the first corner region 131 is disposed inside the display apparatus 1 as shown in FIG. 1.

For example, according to an embodiment, the first corner region 131 is folded in the −y direction with respect to the first edge region 121, in the +x direction with respect to the second edge region 122, and in the −z direction with respect to the center region 110 such that a user viewing an image displayed by the display apparatus 1 is unable to see the first corner region 131.

According to an embodiment, the display apparatus 1 further includes the second through fourth corner regions 132 through 134 in addition to the first corner region 131, and the second through fourth corner regions 132 through 134 have the same structure as the first corner region 131. Alternatively, each of the first through fourth corner regions 131 through 134 may have different structures, or some of the first through fourth corner regions 131 through 134 may have the same structures.

According to an embodiment, the display apparatus 1 include an active area where an image is displayed, and a non-active area that includes wirings that transmit electric signals to the active area, and an embedded circuit portion that controls a displayed image. To improve image esthetics and increase the active area, the non-active area seen by the user can be reduced.

According to an embodiment, the wirings and the embedded circuit portion are disposed in at least one of the first through fourth corner regions 131 through 134. In other words, at least one of the first through fourth corner regions 131 through 134 includes the non-active area. In addition, the second edge region 122 and the fourth edge region 124 further include non-active regions 122ND and 124ND in addition to active regions 122D and 124D that display an image. In addition, the non-active areas 122ND and 124ND included in the second and fourth edge regions 122 and 124 are folded with respect to the active areas 122D and 124D in a direction away from the direction where an image is displayed.

According to an embodiment, a pad region 140 is disposed outside the third edge region 123. and a driving integrated circuit (IC) chip 150 is disposed in the pad region 140. The pad region 140 is folded with respect to the third edge region 123 along a pad line Lc in a direction away from where the image is displayed in the third edge region 123.

According to an embodiment, at least one of the first through fourth corner regions 131 through 134 includes a non-active area, and the first through fourth corner regions 131 through 134 are folded in a direction away from where an image is displayed so as not to be seen by the user. In other words, the non-active area seen by the user is decreased by using at least one of the first through fourth corner regions 131 through 134 as the non-active area where the wirings and the embedded circuit portion are disposed, while configuring the non-active area to be not seen by the user.

Figure 3A:
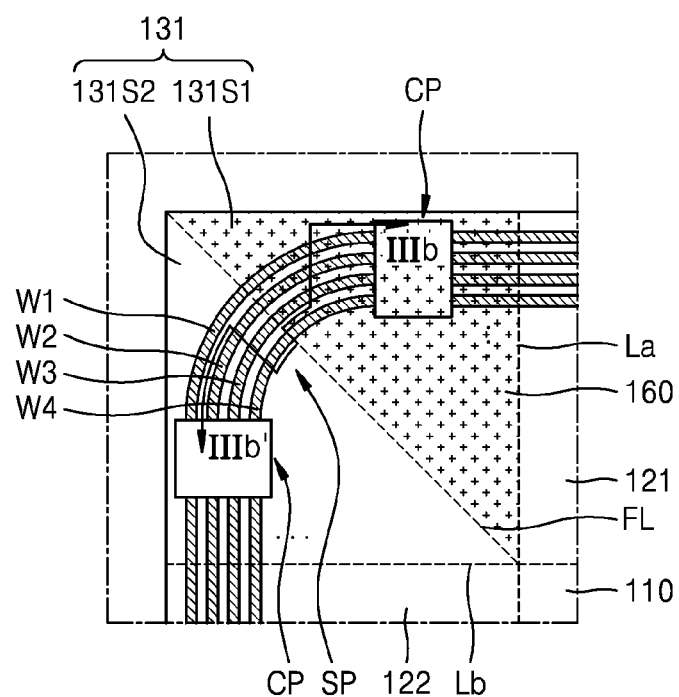
FIG. 3A is an enlarged plan view of a corner region of FIG. 1 before being folded.
Figure 3B:
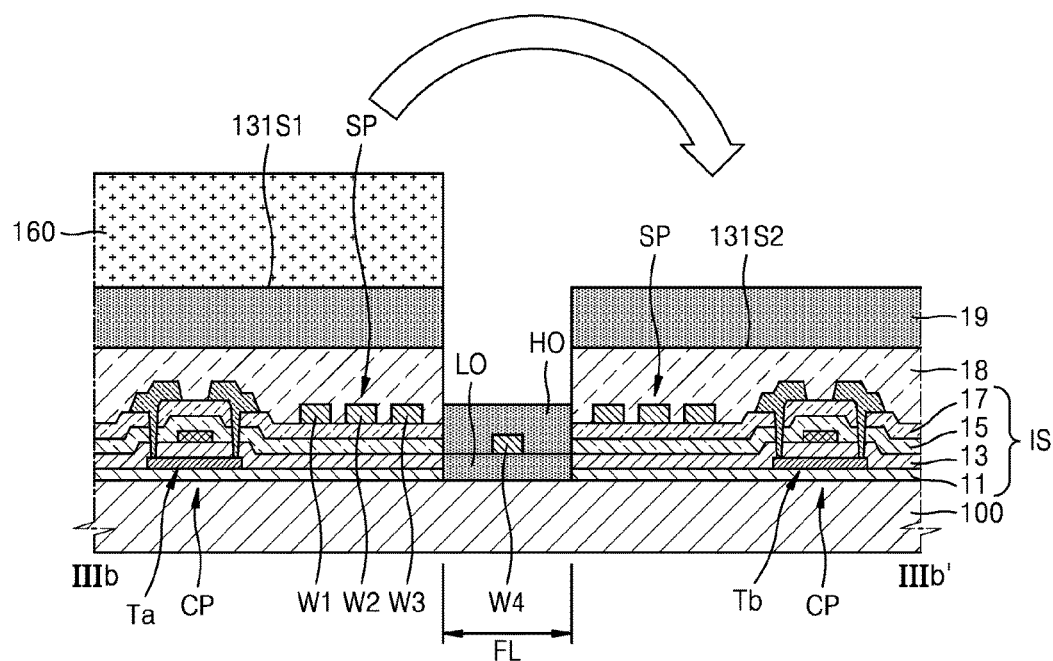
FIG. 3B is a cross-sectional view taken along a line IIIb-IIIb' of FIG. 3A.
Figure 3C:
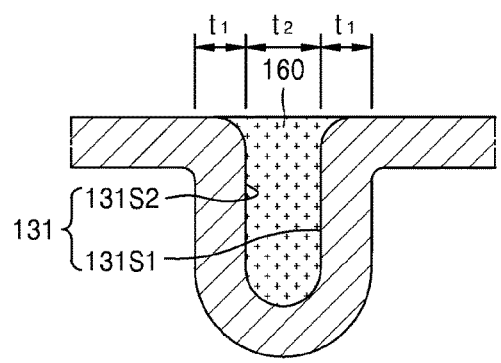
FIG. 3C is a cross-sectional view of a corner region of FIG. 1.

FIG. 3A is an enlarged plan view of the first corner region 131 of FIG. 1 before being folded, FIG. 3B is a cross-sectional view taken along a line IIIb-IIIb' of FIG. 3A, and FIG. 3C is a cross-sectional view of the first corner region 131 of FIG. 1.

FIG. 3A is an enlarged view of the first corner region 131 of FIG. 2. According to an embodiment, the first corner region 131 includes a wiring portion SP and an embedded circuit portion CP. The wiring portion SP includes a plurality of wirings W1 through W4 that transmit data signals or scan signals to an active area or apply a voltage. The embedded circuit portion CP includes at least one TFT, for example, TFTs Ta and Tb, that drives an image displayed in the active area by controlling signals transmitted from the plurality of wirings W1 through W4.

Referring to FIG. 3B, according to an embodiment, an insulating structure IS and the TFTs Ta and Tb included in the embedded circuit portion CP are disposed on the substrate 100. The embedded circuit portion CP is covered by a via insulating layer 18, and a pixel-defining layer 19 is disposed on the via insulating layer 18. For example, the insulating structure IS includes a plurality of layers, such as a buffer layer 11, a gate insulating layer 13, a first interlayer insulating layer 15, and a second interlayer insulating layer 17, formed of an inorganic material, and the via insulating layer 18 and the pixel-defining layer 19 are formed of an organic material.

According to an embodiment, the adhesive layer 160 is disposed on the first surface 131S1 in the first corner region 131. As shown in FIG. 3C, the first and second surfaces 131S1 and 131S2 are folded along the folding line FL to face each other across the adhesive layer 160. In FIGS. 3A and 3B, the adhesive layer 160 is disposed on the first surface 131S1, but alternatively, the adhesive layer 160 may be disposed on the second surface 131S2 or disposed on the first and second surfaces 131S1 and 131S2.

According to an embodiment, at least one of the plurality of wirings W1 through W4 crosses the folding line FL, the insulating structure IS is removed from a region on the substrate 100 that corresponds to the folding line FL, and a lower organic layer LO and an upper organic layer HO respectively disposed below and on the wiring W4. In other words, the insulating structure IS includes an opening corresponding to the folding line FL, the lower organic layer LO and the upper organic layer HO are disposed in the opening, and the wiring W4 is disposed between the lower organic layer LO and the upper organic layer HO. Accordingly, disconnection of the wiring W4 due to cracks generated in the insulating structure IS when the first corner region 131 is folded along the folding line FL can be prevented. The lower organic layer LO and the upper organic layer HO absorb the tensile stress to effectively prevent the tensile stress from being concentrated on the wiring W4.

Referring to FIG. 3C, according to an embodiment, letting a display panel have a first thickness $t_1$ and the adhesive layer 160 have a second thickness $t_2$, a thickness of a region between the first and second edge regions 121 and 122 seen by the user is about $2t_1+t_2$. In other words, a non-active area between the first and second edge regions 121 and 122 and seen by the user has a thickness of about $2t_1+t_2$. Here, $t_1$ may be about 25 μm or less and $t_2$ may be about 30 μm or less.

According to an embodiment, a space of the entire first corner region 131 is used for placing the wiring portion SP and the embedded circuit portion CP, while an area of the first corner region 131 seen by the user is reduced.

Figure 4:
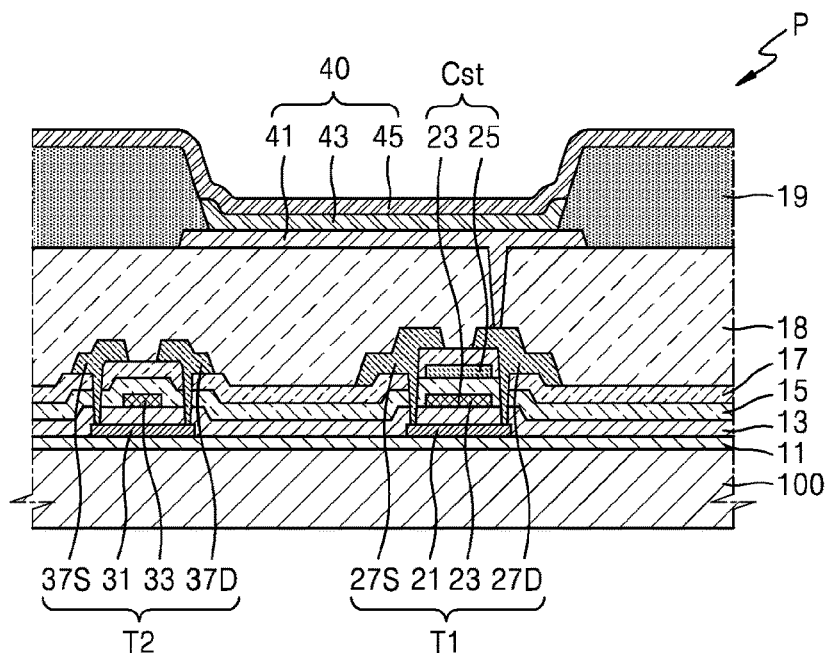
FIG. 4 is a cross-sectional view of a pixel of FIG. 1.

FIG. 4 is a cross-sectional view of a pixel P of FIG. 2.

Hereinafter, the pixel P in the display apparatus 1 according to an embodiment will be described in a stacking order on the substrate 100 with reference to FIG. 4.

According to an embodiment, the display apparatus 1 includes the substrate 100, and the substrate 100 is a flexible substrate that includes polymer resin, such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). According to an embodiment, the substrate 100 includes PI, which is bendable, and has a thickness of several to dozens of μm.

According to an embodiment, a driving circuit unit that drives the display device 40 included in each pixel P is disposed over the substrate 100, and the driving circuit unit includes the first TFT T1, the second TFT T2, and the storage capacitor Cst. The buffer layer 11 is disposed between the substrate 100 and the driving circuit unit. The buffer layer 11 may have a single layer or a multi-layer structure, and increases the flatness of a top surface of the substrate 100 and prevents or reduces impurities from the substrate 100 from infiltrating the first and second TFTs T1 and T2.

According to an embodiment, the first TFT T1 and the second TFT T2 respectively include active layers 21 and 31 that each include polycrystalline silicon or an oxide semiconductor, gate electrodes 23 and 33 insulated from the active layers 21 and 31, and source electrodes 27S and 37S and drain electrodes 27D and 37D disposed on the gate electrodes 23 and 33. The gate insulating layer 13 is disposed between the active layers 21 and 31 and the gate electrodes 23 and 33 and includes an inorganic material, such as a silicon oxide ($SiO_2$), a silicon nitride ($SiN_x$), or a silicon oxynitride ($SiO_xN_y$).

According to an embodiment, the first interlayer insulating layer 15 is disposed over the gate electrodes 23 and 33 and includes an inorganic material, such as $SiO_2$, $SiN_x$, or $SiO_xN_y$. A capacitor electrode 25 is disposed on the first interlayer insulating layer 15 to overlap the gate electrode 23 of the first TFT T1 in plan view, and forms the storage capacitor Cst together with the gate electrode 23.

According to an embodiment, the second interlayer insulating layer 17 is disposed on the capacitor electrode 25 and includes an inorganic material, such as $SiO_2$, $SiN_x$, or $SiO_xN_y$.

According to an embodiment, the source electrodes 27S and 37S and the drain electrodes 27D and 37D are disposed on the second interlayer insulating layer 17, and are respectively connected to the active layers 21 and 31.

According to an embodiment, the via insulating layer 18 includes an organic material and planarizes a surface where the display device 40 is to be formed, and is disposed on the first and second TFTs T1 and T2. The display device 40 is disposed on the via insulating layer 18. For example, the display device 40 is an organic light-emitting device, and includes a pixel electrode 41, an intermediate layer 43 on the pixel electrode 41 that includes an organic emission layer, and an opposite electrode 45 disposed on the intermediate layer 43.

According to an embodiment, the first TFT T1 is a driving TFT, and the pixel electrode 41 may be directly connected to the first TFT T1 or indirectly connected to the first TFT T1 through another TFT that controls emission.

According to an embodiment, the pixel-defining layer 19 has an opening that exposes at least a center portion of the pixel electrode 41, and is disposed on the pixel electrode 41 and formed from an organic material. The intermediate layer 43 is disposed on a region of the pixel electrode 41 that is exposed by the pixel-defining layer 19.

Figure 5:
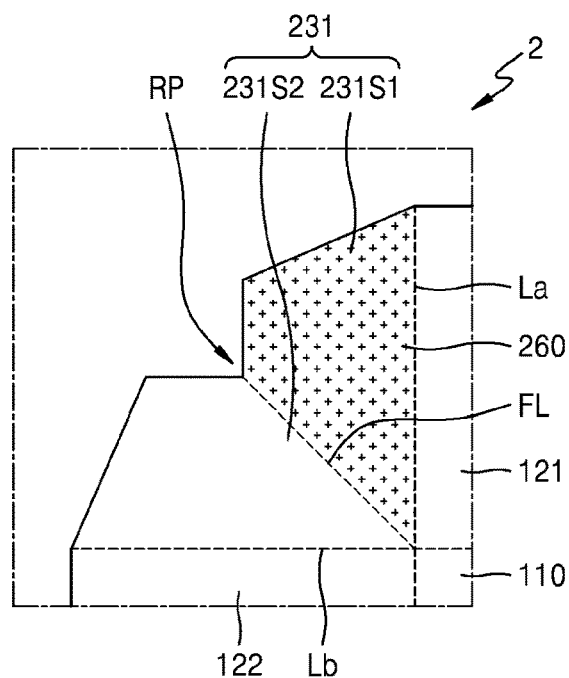
FIGS. 5 through 7 are plan views of corner regions of display apparatuses before being folded, according to embodiments.
Figure 6:
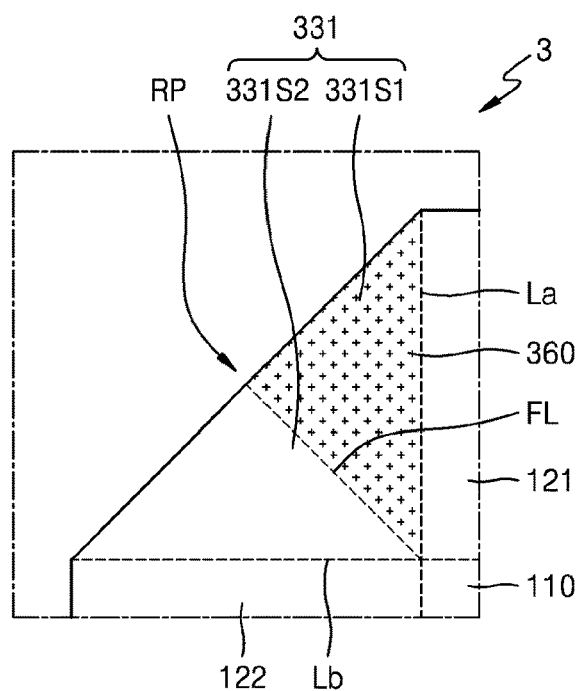
Figure 7:
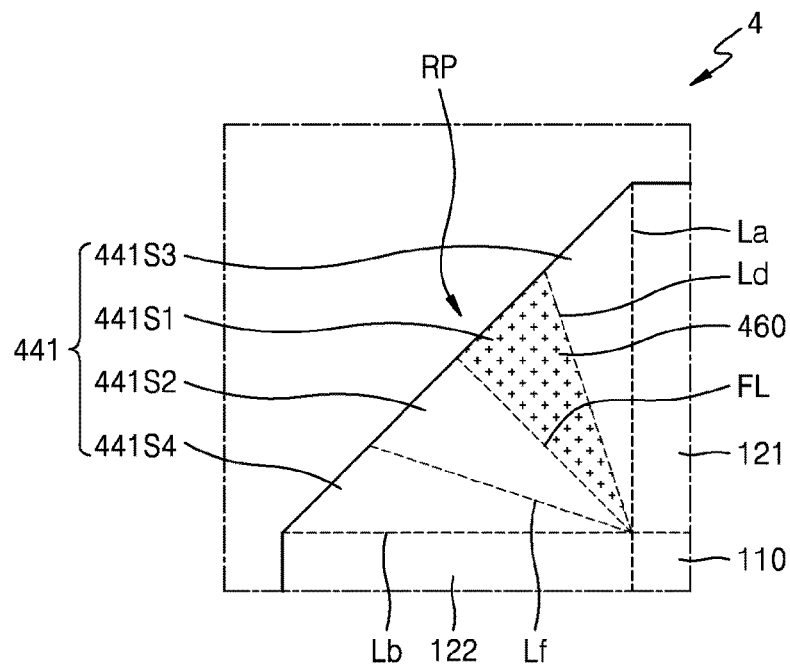

FIGS. 5 through 7 are cross-sectional views of corner regions 231, 331, and 441 of display apparatuses 2, 3, and 4 before being folded, according to embodiments.

FIGS. 5 through 7 are plan view diagrams of the corner regions 231 through 441, in which at least one of the first through fourth corner regions 131 through 134 of the display apparatus 1 of FIG. 1 is modified. However, a shape of a corner region may vary in addition to those shown in FIGS. 5 through 7.

According to an embodiment, the display apparatuses 2 and 3 of FIGS. 5 and 6 include the corner regions 231 and 331, and the corner regions 231 and 331 include first surfaces 231S1 and 331S1 and second surfaces 231S2 and 331S2 that are folded along the folding line FL to face each other. FIGS. 5 and 6 show the corner regions 231 and 331 before being folded; after being folded, the first surfaces 231S1 and 331S1 and the second surfaces 231S2 and 331S2 face each other.

According to an embodiment, adhesive layers 260 and 360 are disposed on the first surfaces 231S1 and 331S1. In addition, as shown in FIG. 3C, the adhesive layers 260 and 360 can be disposed between the first surfaces 231S1 and 331S1 and the second surfaces 231S2 and 331S2. The corner regions 231 and 331 do not form a right angle at an outermost region thereof like the first through fourth corner regions 131 through 134 of FIG. 2, and corner region 231 includes removed portions RP.

According to an embodiment, in FIG. 5. to remove a portion of the first corner region 131 of FIG. 2, two cut lines having discontinuous slopes are provided in the first corner region 131 to from a trapezoidal shape in which the first and second surfaces 231S1 and 231S2 are symmetrical about the folding line FL. In FIG. 6, the corner region 331 includes a diagonal cut line and has a right-angled triangular shape in which the first and second surfaces 331S1 and 331S2 are symmetrical about the folding line FL.

Referring to FIG. 7, according to an embodiment, the corner region 441 included in the display apparatus 4 according to an embodiment includes the removed portion RP formed by a cut line shown in FIG. 6, and further includes, in addition to a first surface 441S1 and a second surface 441S2 that are folded to face each other, a third surface 441S3 disposed between the first surface 441S1 and the first edge region 121, and a fourth surface 441S4 disposed between the second surface 441S2 and the second edge region 122.

According to an embodiment, an adhesive layer 460 is disposed on the first surface 441S1. The adhesive layer 460 will be disposed between the first and second surfaces 441S1 and 441S2 as also shown in FIG. 3C when the corner region 441 is folded.

According to an embodiment, the corner region 441 is folded with respect to the first and second regions 121 and 122 along the first and second corner lines La and Lb at an angle in a direction away from where an image is displayed, and the first and second surfaces 441S1 and 441S2 are again folded respectively along additional folding lines Ld and Lf with respect to the third and fourth surfaces 441S3 and 441S4 in the direction away from where an image is displayed. In this case, the third and fourth surfaces 441S3 and 441S4 can be seen by the user. In FIG. 7, the additional folding lines Ld and Lf are respectively provided between the folding line FL and the first edge region 121 and between the folding line FL and the second edge region 122. However, embodiments are not limited thereto, and the additional folding lines Ld and Lf may be provided between the folding line FL and the first edge region 121 or between the folding line FL and the second edge region 122, and there may be two or more additional folding lines.

In other words, according to an embodiment, a plurality of corner lines are formed in the corner region 441, and the corner region 441 can be folded at various angles along the corner lines such that the corner region 441 has various shapes.

Figure 8:
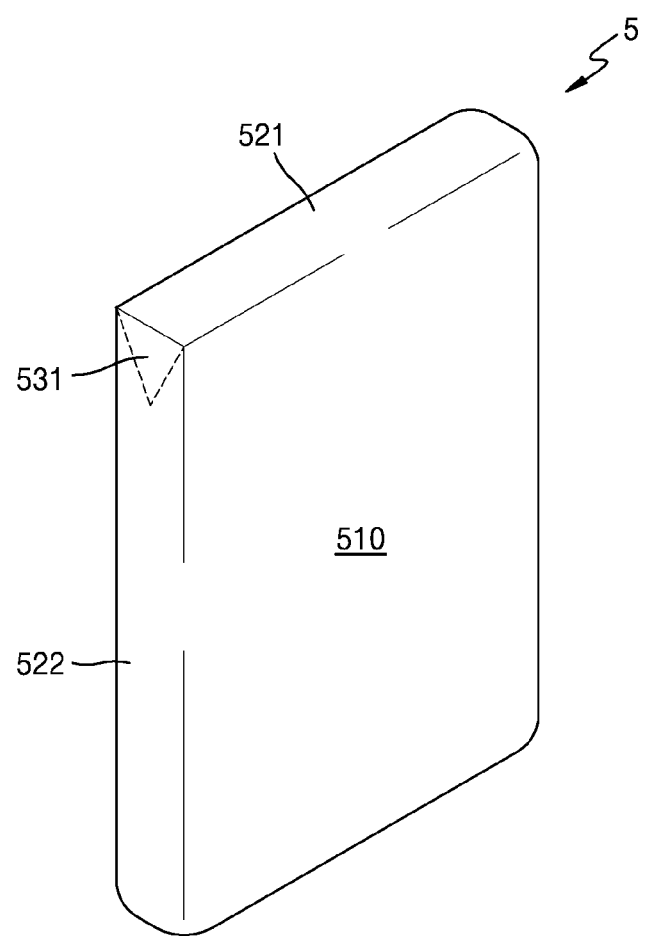
FIG. 8 is a perspective view of a display apparatus according to another embodiment.
Figure 9:
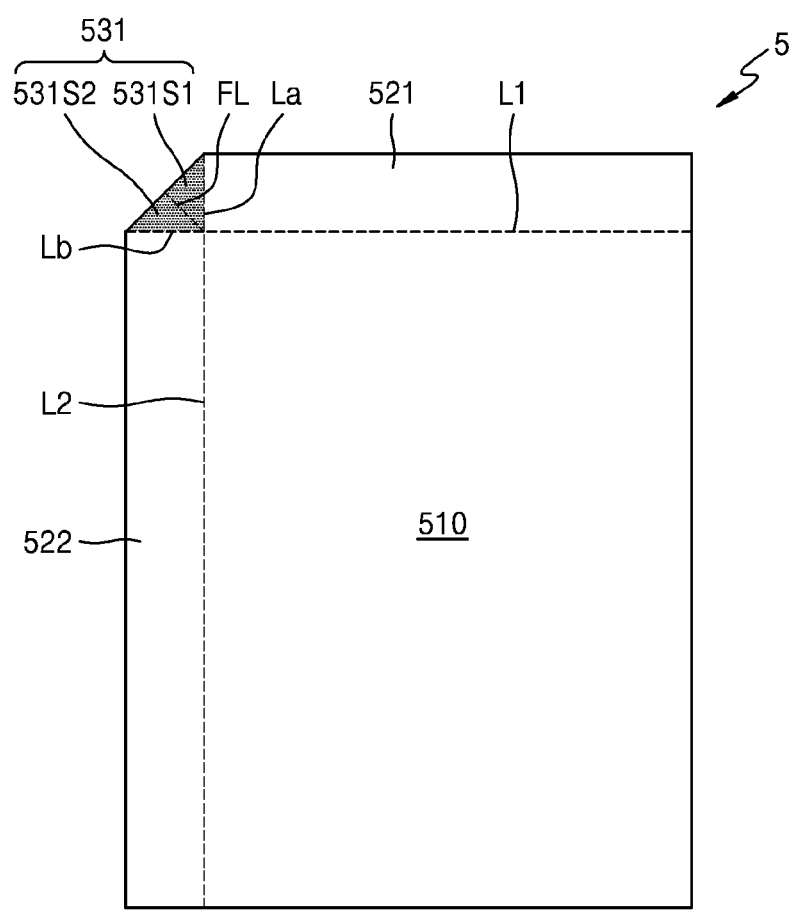
FIG. 9 is a pre-folding plan view of a display apparatus of FIG 8.

FIG. 8 is a perspective view of a display apparatus 5 according to another embodiment, and FIG. 9 is a pre-folding plan view of the display apparatus 5 of FIG. 8.

According to an embodiment, the display apparatus 5 in FIGS. 8 and 9 include a center region 510, and a first edge region 521 and a second edge region 522, which are folded indirections away from where an image is displayed along the first and second lines L1 and L2 with respect to the center region 510.

According to an embodiment, the display apparatus 5 includes at least one folding line FL, and a corner region 531 that includes a first surface 531S1 and a second surface 531S2 that are folded along the folding line FL to face each other.

According to an embodiment, the corner region 531 is folded along the first and second corner lines La and Lb with respect to the first and second edge regions 521 and 522 in a direction away from where an image is displayed. The corner region 531 includes a non-active area that includes a plurality of wirings and an embedded circuit portion, and at least a part of the non-active area is not seen by a user after the corner region 531 is folded.

Accordingly, according to an embodiment, the corner region 531 is used as a non-active area while reducing the area of the non-active area seen by a user.

Hereinafter, a method of manufacturing a display apparatus, according to an embodiment, will be described with reference to FIGS. 1, 2, 3A, 3B, and 3C.

A method according to an embodiment includes preparing a display panel, including: the center region 110; the first and second edge regions 121 and 122 that extend in different directions from the center region 110; and the first corner region 131 between the first and second edge regions 121 and 122 that includes the folding line FL, as shown in FIG. 2. The center region 110 and the first and second edge regions 121 and 122 each include the display device 40 of FIG. 4 that displays an image.

Referring to FIGS. 3A and 3B, according to an embodiment, the first corner region 131 includes the wiring portion SP that includes the plurality of wirings W1 through W4, and the embedded circuit portion CP that includes at least one TFT, i.e., the TFTs Ta and Tb, that control signals received from the plurality of wirings W1 through W4.

According to an embodiment, the first corner region 131 includes an opening located at the folding line FL, and includes the insulating structure IS that includes at least one inorganic insulating layer, such as the buffer layer 11, the gate insulating layer 13, the first interlayer insulating layer 15, and the second interlayer insulating layer 17. The lower organic layer LO and the upper organic layer HO are disposed in the opening. At least one of the plurality of wirings W1 through W4 crosses the folding line FL, and the least one of the plurality of wirings W1 through wiring W4 that crosses the folding line FL is provided between the lower organic layer LO and the upper organic layer HO.

According to an embodiment, to form the display apparatus 1 of FIG. 1 from the display panel of FIG. 2, the first and second edge regions 121 and 122 are folded with respect to the center region 110 in a direction away from where an image is displayed, and the first corner region 131 is folded along the folding line FL such that the first and second surfaces 131S1 and 131S2 face each other.

Referring to FIGS. 3B and 3C, according to an embodiment, before folding the first corner region 131 along the folding line FL, the adhesive layer 160 is formed on at least one of the first and second surfaces 131S1 and 131S2 of the first corner region 131, and by folding the first corner region 131 along the folding line FL as shown by an arrow of FIG. 3B, the first and second surfaces 131S1 and 131S2 face each other across the adhesive layer 160 as shown in FIG. 3C.

According to an embodiment, the corner regions 231 through 441 have the shapes shown in FIGS. 5 through 7, and to form the display apparatuses 2 through 4 having corner regions 231 through 441, portions of the corner regions 231 through 441 may be removed from the display panel of FIG. 2 before folding the corner regions 231 through 441 along the folding line FL. The corner regions 231 through 441 having the removed portions RP may have various shapes.

According to embodiments, the display apparatuses 1 through 5 according to embodiments have 3D shapes in which at least two edge regions are folded, and a corner region is folded along a folding line in a direction away from where an image is displayed.

Accordingly, according to embodiments, adjacent edge regions can be easily folded, a corner region can be used as a non-active area where wirings and an embedded circuit portion are disposed, and the non-active area can be configured to be not seen by a user. Accordingly, an area of the non-active area seen by a user can be reduced.

It should be understood that exemplary embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
    a center region;
    a first edge region and a second edge region, each folded with respect to the center region; and
    a first corner region connected to the first edge region and the second edge region and that includes at least one folding line and a first surface and a second surface that face each other by being folded along the at least one folding line,
    wherein the center region, the first edge region, and the second edge region each include a display device that displays an image.

2. The display apparatus of claim 1, further comprising an adhesive layer disposed between the first surface and the second surface.

3. The display apparatus of claim 1, wherein the first corner region is folded with respect to the first edge region and the second edge region in a direction away from where an image is displayed.

4. The display apparatus of claim 1, wherein the display device includes a pixel electrode, an intermediate layer disposed on the pixel electrode that includes an organic emission layer, and an opposite electrode disposed on the intermediate layer.

5. The display apparatus of claim 1, wherein the first corner region comprises:
a wiring portion that includes a plurality of wirings; and
an embedded circuit portion that includes at least one thin-film transistor that controls signals received from the plurality of wirings.

6. The display apparatus of claim 5, wherein the first corner region further comprises an insulating structure fat has an opening corresponding to the at least one folding line and that includes at least one inorganic insulating layer.

7. The display apparatus of claim 6, further comprising a lower organic layer and an upper organic layer disposed in the opening,
wherein the plurality of wirings are disposed at the at least one folding line between the lower organic layer and the upper organic layer.

8. The display apparatus of claim 1, wherein at least one of the first edge region and the second edge region includes an active area that displays an image and a non-active area disposed outside the active area.

9. The display apparatus of claim 1, wherein the first corner region further comprises an additional folding line in at least one of a region between the at least one folding line and the first edge region and a region between the at least one folding line and the second edge region.

10. The display apparatus of claim 1, wherein the center region is rectangular, and the display apparatus further includes a third edge region and a fourth edge region, wherein the first edge region, the second edge region, the third edge region and the fourth edge region respectively extend from each of four sides of the center region.

11. The display apparatus of claim 10, wherein the first edge region, the second edge region, the third edge region, and the fourth edge region are each folded with respect to the center region in a direction away from where an image is displayed, and
the display apparatus further includes a second corner region, a third corner region, and a fourth corner region respectively disposed between the second edge region and the third edge region, between the third edge region and the fourth edge region, and between the fourth edge region and the first edge region, each including a folding line.

12. The display apparatus of claim 11, further comprising a pad region that extends from at least one of the first through fourth edge regions, wherein the pad region is folded with respect to the at least one of the first through fourth edge regions.

13. A method of manufacturing a display apparatus, the method comprising:
preparing a display panel that includes a center region, a first edge region and a second edge region that extend in different directions from the center region, and a corner region disposed between the first edge region and the second edge region that includes a folding line;
folding the first edge region and the second edge region with respect to the center region in a direction away from where an image is displayed;
removing a part of the corner region; and
folding the corner region along the folding line such that a first surface and a second surface of the corner region face each other.

14. The method of claim 13, further comprising, before folding the corner region, forming an adhesive layer on at least one of the first surface and the second surface of the corner region.

15. The method of claim 13, wherein the center region, the first edge region, and the second edge region each include a display device that displays an image.

16. The method of claim 13, wherein the corner region comprises:
a wiring portion that includes a plurality of wirings; and
an embedded circuit portion that includes at least one thin-film transistor that controls signal received from the plurality of wirings.

17. The method of claim 16, wherein the corner region further comprises an insulating structure that has an opening at the folding line that includes at least one inorganic insulating layer.

18. The method of claim 17, wherein the display apparatus further comprises a lower organic layer and an upper organic layer disposed in the opening,
wherein. the plurality of wirings at the folding line are disposed between the lower organic layer and the upper organic layer.

19. A display apparatus, comprising:
a center region that displays an image; and
a first corner region connected to adjacent edges of the center region,
wherein the first corner region includes at least one folding line and a first surface and a second surface that face each other by being folded along the at least one folding line,
wherein the first corner region is folded with respect to the edges of the center region in a direction away from where an image is displayed, and
wherein at least one of the first edge region and the second edge region includes an active area that displays an image and a non-active area disposed outside the active area.

20. A display apparatus, comprising:
a center region that displays an image; and
a first corner region connected to adjacent edges of the center region,
wherein the first corner region includes at least one folding line and a first surface and a second surface that face each other by being folded along the at least one folding line,
wherein the first corner region is folded with respect to the edges of the center region in a direction away from where an image is displayed, and
wherein the first corner region comprises:
a wiring portion that includes a plurality of wirings; and
an embedded circuit portion that includes at least one thin-film transistor that controls signals received from the plurality of wirings.

* * * * *